United States Patent
Toyama

(10) Patent No.: US 8,094,495 B2
(45) Date of Patent: Jan. 10, 2012

(54) NONVOLATILE MEMORY DEVICE

(75) Inventor: Shunichi Toyama, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 169 days.

(21) Appl. No.: 12/615,472

(22) Filed: Nov. 10, 2009

(65) Prior Publication Data

US 2010/0128527 A1    May 27, 2010

(30) Foreign Application Priority Data

Nov. 25, 2008  (JP) ................................. 2008-300043
Aug. 19, 2009  (KR) ........................ 10-2009-0076844

(51) Int. Cl.
   *G11C 11/34* (2006.01)

(52) U.S. Cl. ......... 365/185.03; 365/185.11; 365/185.12; 365/185.18; 365/185.22; 365/185.24; 365/185.29

(58) Field of Classification Search ............. 365/185.03, 365/185.11, 185.12, 185.18, 185.22, 185.24, 365/185.29
See application file for complete search history.

(56) References Cited

U.S. PATENT DOCUMENTS

| | | | |
|---|---|---|---|
| 6,285,597 B2* | 9/2001 | Kawahara et al. | 365/185.22 |
| 6,442,070 B1* | 8/2002 | Tanaka et al. | 365/185.22 |
| 6,496,418 B2* | 12/2002 | Kawahara et al. | 365/185.18 |
| 6,894,931 B2* | 5/2005 | Yaegashi et al. | 365/185.22 |
| 7,573,744 B2* | 8/2009 | Edahiro et al. | 365/185.11 |
| 7,593,267 B2* | 9/2009 | Fujiu et al. | 365/185.22 |
| 7,656,711 B2* | 2/2010 | Shibata et al. | 365/185.11 |
| 7,679,977 B2* | 3/2010 | Shirakawa | 365/185.18 |
| 7,813,170 B2* | 10/2010 | Shibata | 365/185.03 |
| 7,843,723 B2* | 11/2010 | Shibata | 365/185.03 |
| 7,916,547 B2* | 3/2011 | Hosono | 365/185.18 |
| 2007/0153574 A1 | 7/2007 | Kouno | |

FOREIGN PATENT DOCUMENTS

JP          2007179701          7/2007

* cited by examiner

*Primary Examiner* — Trong Phan
(74) *Attorney, Agent, or Firm* — Volentine & Whitt, PLLC

(57) ABSTRACT

A nonvolatile memory device includes a data memory cell array having multi level memory cells divided into two groups, a write sequence memory cell array configured to store a write sequence indicating in which of the two groups the multi level data was written first, and a write time memory cell array configured to store the number of write operations performed on the memory cells. The memory device further includes a control circuit configured to control a program operation by determining allocation of data corresponding to a minimum physical voltage distribution causing a reaction of the memory cells, such that a shift of a first minimum physical voltage causing a reaction due to the first write operation and a shift of a second minimum physical voltage causing a reaction due to the second write operation are equal regardless of write sequence.

5 Claims, 7 Drawing Sheets

* R1 ~ R3 Are Levels Of Read Voltages
* V1 ~ V4 Are Levels Of Verify Voltages

Fig. 3

Output Data Determination Method

| | Write From 'A' | | Write From 'B' | |
|---|---|---|---|---|
| | First Write | Second Write | First Write | Second Write |
| 'A' Read | Determination of Data At 'R1'<br><br>11 : Erase<br>10 : Write | Determination of Data At 'R1' And 'R3'<br><br>11/10 : Erase<br>01/00 : Write | Erase Data Output | Determination of Data At 'R2'<br><br>11/01 : Erase<br>00/10 : Write |
| 'B' Read | Erase Data Output | Determination of Data At 'R2'<br><br>11/01 : Erase<br>00/10 : Write | Determination of Data At 'R1'<br><br>11 : Erase<br>10 : Write | Determination of Data At 'R1' And 'R3'<br><br>11/10 : Erase<br>01/00 : Write |

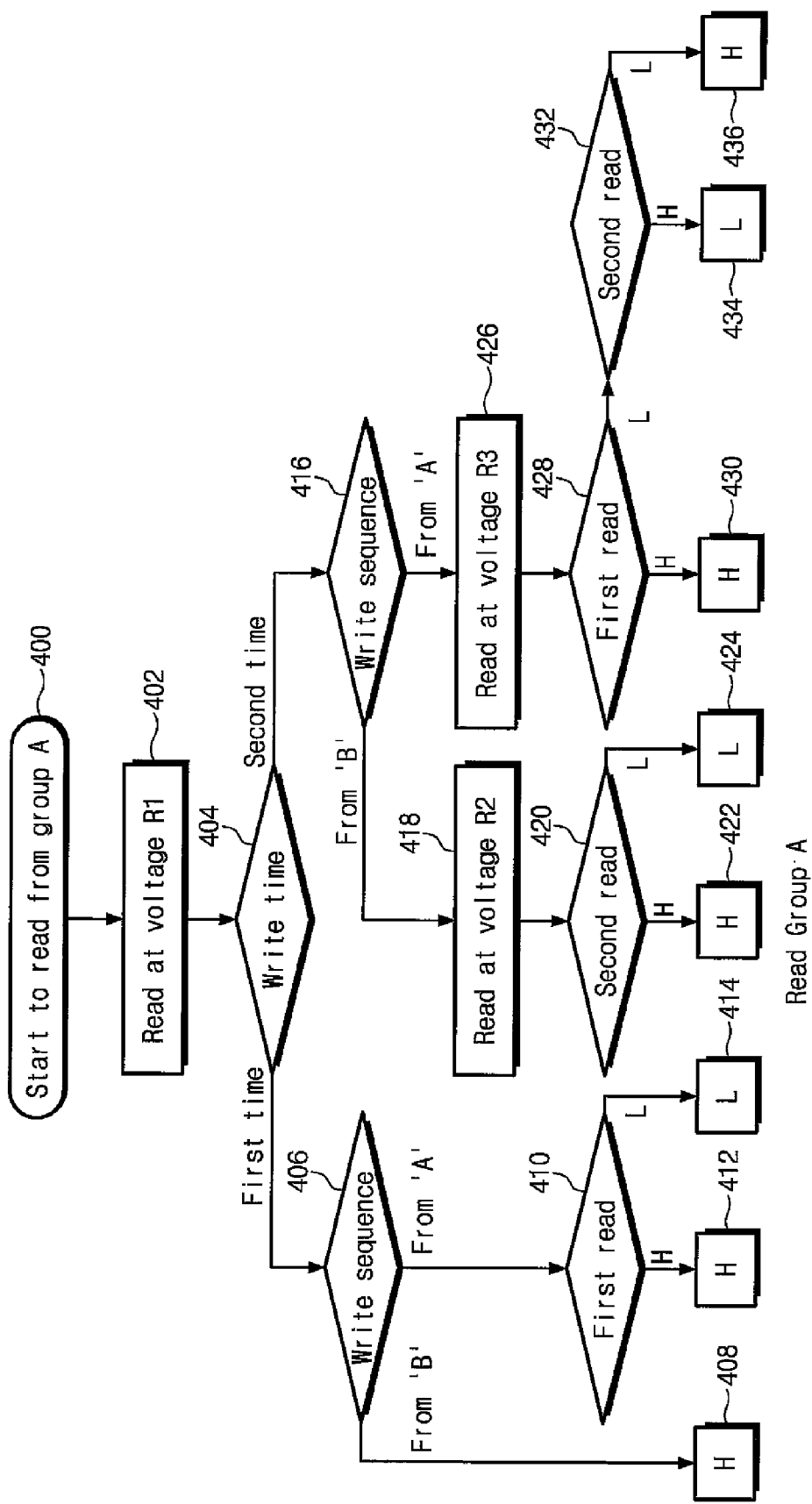

NONVOLATILE MEMORY DEVICE

CROSS-REFERENCE TO RELATED APPLICATIONS

A claim of priority is made to Korean Patent Application No. 10-2009-0076844, filed Aug. 19, 2009, and to Japanese Patent Application No. 2008-300043, filed Nov. 25, 2008, the subject matters of which are hereby incorporated by reference.

BACKGROUND

The present disclosure relates to nonvolatile memory devices, and more particularly, to nonvolatile memory devices capable of increasing multi level data write/read speeds.

Nonvolatile memory devices, especially flash memory devices, are widely used for data storage in portable devices (e.g., portable phones and digital cameras) because they are electrically erasable and programmable and can retain data even when powered-down. For implementation of large capacity and low cost, extensive research is being conducted on flash memory devices that can store data of two or more bits in each memory cell. For example, a flash memory device may store two-bit data in each memory cell by having minimum physical voltages causing four different reactions.

FIGS. 6A and 6B are diagrams illustrating the relationship between data of a memory cell of a typical nonvolatile memory device and minimum physical voltage distributions causing a reaction of the memory cell, and corresponding write/read operations.

Referring to FIGS. 6A and 6B, the unit of data written at a time is divided into first and second pages, so that either of the pages may be written first. FIG. 6A shows programming from a second page to a first page, and FIG. 6B shows program programming form a first page to a second page. As shown in both figures, the first page is the least significant bit (LSB) of two-bit data and the second page is the most-significant bit (MSB) of the two-bit data. In an initial state 0, both the first and second pages (LSB and MSB) have a bit value of '1'. In FIG. 6A, the second page is first programmed such that the MSB either remains "1" (state 0) or is changed to "0" (state 2), and then the first page is programmed such that either state 0 or state 2 is maintained, or state 0 is changed to state 1, or state 2 is changed to state 3. In FIG. 6B, the first page is first programmed such that the LSB either remains "1" (state 0) or is changed to "0" (state 1), then the second page is programmed such that either state 0 or state 1 is maintained, or state 0 is changed to state 3, or state 1 is changed to state 2. Also shown in FIGS. 6A and 6B are word line voltages A and C for reading first page data, word line voltage B for reading second page data, and word line verify voltages used in a read verify operation. Furthermore, information about whether the first page is written is stored in another memory device to accelerate the read operation.

Also, the method for shifting a minimum physical voltage causing a reaction differs according to the sequence of writing to the pages. There is a large difference between a shift of a minimum physical voltage causing a reaction when programming from the second page to the first page, as illustrated in FIG. 6A, and a shift of a minimum physical voltage causing a reaction when programming from the first page to the second page, as illustrated in FIG. 6B. Thus, write speed is maximized during the second write operation of FIG. 6B. Therefore, average write speed increases, while write speed on spec does not increase as much.

SUMMARY

Embodiments of the inventive concept provide nonvolatile memory devices that can increase a write speed on spec by reducing a shift of a minimum physical voltage causing a reaction.

Embodiments of the inventive concept also provide nonvolatile memory devices that can prevent a shift of a minimum physical voltage causing a preset low reaction, in writing a minimum physical voltage causing a high reaction, by process miniaturization.

Embodiments of the inventive concept provide a nonvolatile memory device including a data memory cell array including multi level memory cells divided into two groups to store multi level data respectively in the memory cells of each group; a write sequence memory cell array configured to store a write sequence indicating in which of the two groups the respective multi level data was written first; and a write time memory cell array configured to store the number of write operations performed on the memory cells. The memory device further includes a control circuit configured to control a program operation for writing data in the data memory cell array and a read operation for reading data from the data memory cell array.

The control circuit controls the program operation by determining allocation of data corresponding to a minimum physical voltage distribution causing a reaction of the memory cells, such that a shift of a first minimum physical voltage causing a reaction due to the first write operation and a shift of a second minimum physical voltage causing a reaction due to the second write operation are equal regardless of the write sequence. Accordingly, the shifts of the minimum physical voltages causing the reactions may be averaged, for example, to increase the write speed.

In some embodiments, each group is set to store data that is more than a maximum number of words that are writable at a time. Accordingly, data can be stored in a word-by-word basis for each group, for example.

In other embodiments of the inventive concept, a nonvolatile memory device includes a data memory cell array including multi level memory cells divided into two groups to store multi level data, respectively, in the corresponding memory cells of each group, where minimum physical voltages causing reactions of state 0, state 1, state 2 and state 3, set to sequentially increase minimum physical voltages causing reactions, are different from each other. The nonvolatile memory device further includes a write sequence memory cell array configured to store a write sequence indicating in which of the two groups the respective multi level data was first written; a write time memory cell array configured to store the number of write operations on the memory cells; and a control circuit configured to control a program operation of writing data in the data memory cell array and a read operation of reading data from the data memory cell array.

The control circuit controls the program operation by setting a range of a minimum physical voltage causing a target reaction in a first write operation to be larger than a range of a minimum physical voltage causing a reaction of state 1 and state 2 in the second write operation. The control circuit also controls the program operation by setting the minimum physical voltage causing the target reaction to be lower than the minimum physical voltage causing the reaction of state 2, in the second write operation for state 3, in order not to shift the minimum physical voltage causing the reaction of state 2. Accordingly, the first write operation can be performed more rapidly than the typical write operation, for example. Also, it is possible to prevent a shift of the minimum physical voltage causing the reaction of state 2, in the write operation on state 3, by process miniaturization.

In some embodiments, the second write operation is performed in the order of state 3, state 2 and state 1. Accordingly, it is possible, for example, to prevent errors and damage to the memory cell with a minimum physical voltage causing a low reaction.

In other embodiments, the write data is configured to allocate logic "11", logic "01", logic "00" and logic "10" to state 0, state 1, state 2 and the state 3, respectively. Accordingly, a shift of the minimum physical voltage causing a reaction can be reduced.

BRIEF DESCRIPTION OF THE DRAWINGS

The accompanying drawings are included to provide a further understanding of the embodiments of the inventive concept, and are incorporated in and constitute a part of this specification. Exemplary embodiments of the inventive concept will be described with reference to the attached drawings, in which:

FIG. 3 is a diagram illustrating a method for determining output data by a difference in read group, write sequence and write time, according to an exemplary embodiment of the inventive concept;

FIGS. 4 and 5 are flow charts illustrating a representative read method, according to an exemplary embodiment of the inventive concept.

DETAILED DESCRIPTION OF THE EMBODIMENTS

Figure 1:
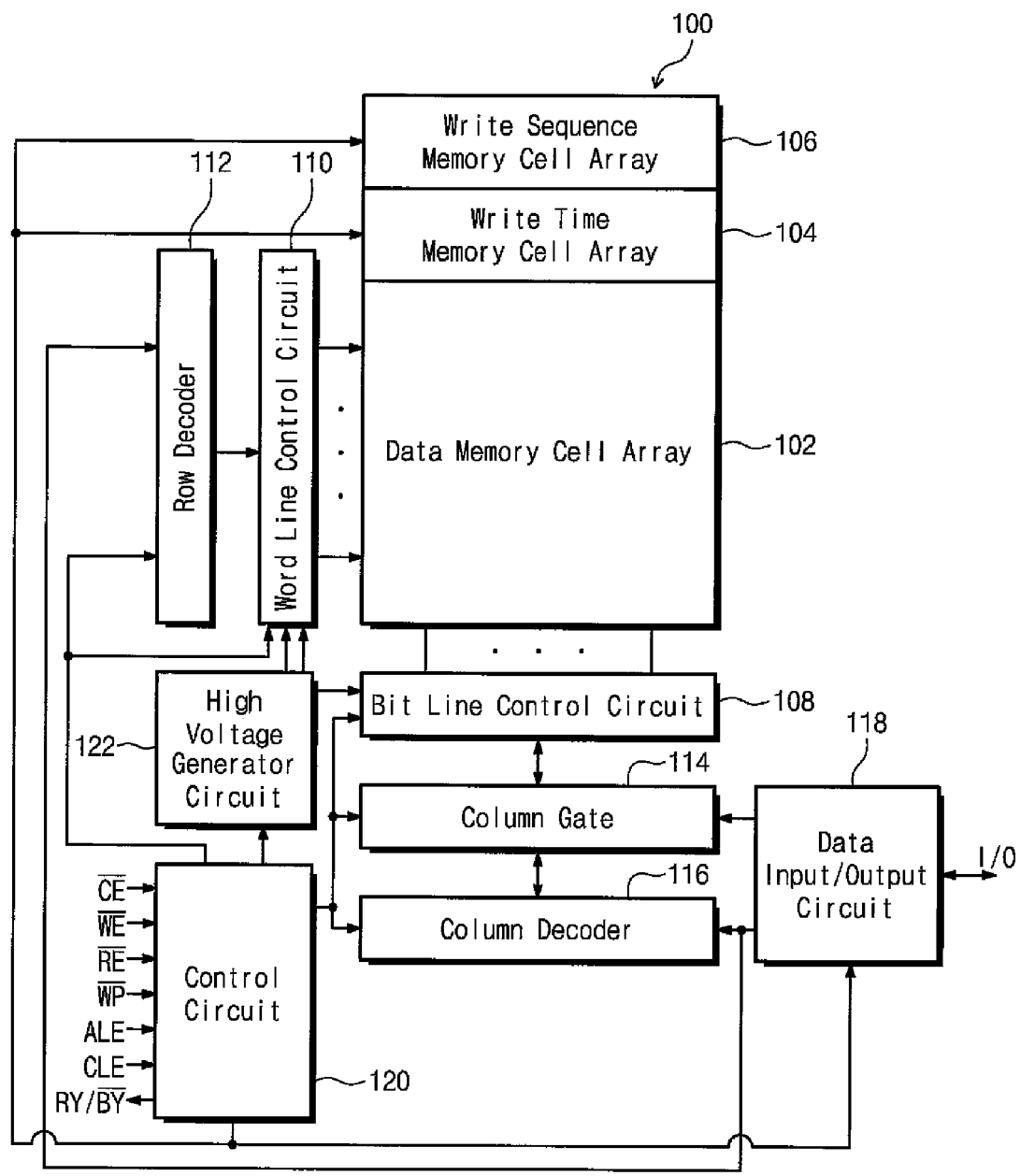
FIG. 1 is a block diagram of a nonvolatile memory device, according to an exemplary embodiment of the inventive concept.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments.

Hereinafter, exemplary embodiments of the inventive concept will be described in detail with reference to the accompanying drawings. Throughout the drawings and written description, like reference numerals will be used to refer to like or similar elements.

FIG. 1 is a block diagram of a nonvolatile memory device 100, according to an exemplary embodiment of the inventive concept.

Referring to FIG. 1, a data memory cell array 102 includes multiple word lines, multiple bit lines, and multi level memory cells arranged in matrix form at intersections of the word lines and the bit lines. A word line control circuit 110 and a bit line control circuit 108 are connected to the data memory cell array 102.

The data memory cell array 102 is divided into groups, and multi level data are respectively stored in corresponding memory cells of each group. For example, if the number of data is four, the data memory cell array 102 is divided into two groups, to which identification addresses are allocated for selecting the groups.

The nonvolatile memory device 100 also includes a write sequence memory cell array 106, which is configured to store the sequence of each write unit, and a write time memory cell array 104, which is configured to store write times for the multi level memory cells. The write sequence memory cell array 106 and the write time memory cell array 104 are adjacent to the data memory cell array 102. The word line control circuit 110 selects a word line of the data memory cell array 102 to apply voltages for read/write (program)/erase operations.

A row decoder 112 controls the word line control circuit 110 to select a word line. The bit line control circuit 108 includes multiple data latch circuits (not illustrated). The bit line control circuit 108 reads the data of the multi level memory cells of the data memory cell array 102 through the bit lines, detects (verifies) the states of the multi level memory cells of the data memory cell array 102 through the bit lines, or applies write voltages to the multi level memory cells of the data memory cell array 102 through the bit lines to perform a write operation.

Also, a column gate 114, a column decoder 116 and a data input/output circuit 118 are connected to the bit line control circuit 108. The data latch circuits of the bit line control circuit 108 are selected by the column decoder 116 to output the read data of the multi level memory cells from a data input/output terminal I/O to an external device, through the column gate 114 and the data input/output circuit 118.

Write data, input from the external device to the data input/output terminal I/O, are input through the data input/output circuit 118 to the data latch circuit selected by the column gate 114 and the column decoder 116. A control circuit 120 controls an overall operation of the nonvolatile memory device 100, including data processing. That is, the control circuit 120 controls the row decoder 112, the bit line control circuit 108, the column gate 114, the column decoder 116, the data input/output circuit 118, and a high voltage generator circuit 122 to control various data processing operations such as read/write/erase operations.

The control circuit 120 writes the number of times write operations are performed on the multi level memory cells of the data memory cell array 102 in the write time memory cell array 104. Also, the control circuit 120 writes the sequence of write operations performed on the groups of the data memory cell array 102 in the write sequence memory cell array 106. During a read operation, the control circuit 120 reads multi level data of each of the groups with reference to the write sequence stored in the write sequence memory cell array 106 and the number of write times stored in the write time memory cell array 104.

A chip enable signal /CE, a write enable signal /WE, a read enable signal/RE, a command latch enable signal CLE, an address latch enable signal ALE and a write protect signal /WP are input from an external device to the control circuit 120. A ready/busy signal RY//BY signal is output from the control circuit 120.

Also, an address, data and a command, input from the data input/output terminal I/O, are input through the data input/output circuit 118 to the control circuit 120. The high voltage generator circuit 122 generates a voltage that is used by the nonvolatile memory device 100 to perform a read/write/erase operation. In the nonvolatile memory device 100, electrons are injected into the floating gates of the multi level memory cells to program/store data in the multi level memory cells of the data memory cell array 102. In this case, the state in which electrons are not accumulated in the floating gate is detected as logic 1, and the state in which electrons are accumulated in the floating gate through injection is detected as logic "0".

For example, when the multi level data is able to indicate four numbers, four states, i.e., state 0, state 1, state 2 and state 3, are allocated respectively to "logic 11", "logic 01", "logic 00" and "logic 10" according to corresponding minimum physical voltages causing reactions of the memory cells. Allocation of the states and corresponding logics is not limited to the above allocation, but may vary according to circumstances.

A method for performing a write (program) operation on the nonvolatile memory device, according to an embodiment of the inventive concept, will be described below.

First, the data memory cell array 102 storing multi level data (for example, four level data) is divided into two groups, and the multi level data are respectively stored in the groups. That is, the data are stored respectively in physically separated memory cells of each group. In this case, each group is set to store data that is more than the maximum number of words that can be written at a time. Hereinafter, the two groups will be referred to as group A and group B, respectively.

Figure 2:
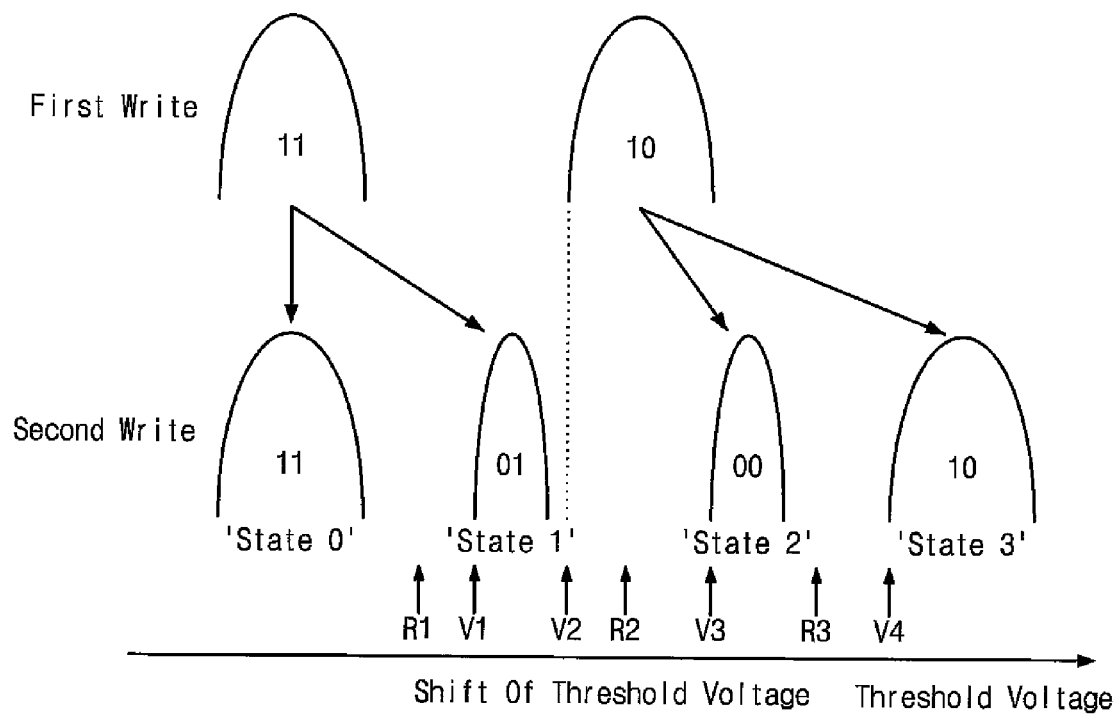
FIG. 2 is a diagram illustrating a shift of a minimum physical voltage causing a reaction due to a write operation, according to an exemplary embodiment of the inventive concept.

FIG. 2 is a diagram illustrating a shift of a minimum physical voltage causing a reaction due to a write operation, according to an embodiment. The write sequence may be from group A to the group B or from group B to group A. Regardless of which group data is first written, a shift of a minimum physical voltage causing a reaction due to the first read operation and a shift of a minimum physical voltage causing a reaction due to the second read operation become equal to each other, as illustrated in FIG. 2.

In FIG. 2, R1~R3 denote levels of the read voltage, and V1~V4 denote levels of the verify voltage. The state after the first write operation is set to logic "10", and the verify voltage corresponding to the logic "10" of the first write operation is set to V2. Also, the range of the minimum physical voltage causing the target reaction for each of logic "11" and logic "10" in the first write operation is set to be larger than the range of the minimum physical voltage causing the reaction for each of state 1 and state 2 in the second write operation. Accordingly, the range of the minimum physical voltage causing the reaction of the state after writing logic "10" in the first write operation is not difficult as compared to the range of the minimum physical voltage causing the reaction of logic "01" or logic "00" in the second write operation. Therefore, a detailed write operation is unnecessary, and a rough write operation may be performed for the first write operation. Thus, the first write operation can be performed more rapidly than a typical write operation.

Notably, in order not to shift the minimum physical voltage causing the reaction of state 2, the minimum physical voltage causing the target reaction of logic "10" is set to V2, which is lower than the minimum physical voltage V3 causing the reaction of state 2 in the second write operation. This prevents damage to the memory cell that is low in the minimum physical voltage causing the reaction due to the write operation for the adjacent memory cell, which may otherwise occur, for example, due smaller distances between memory cells due to miniaturization. Write methods according to embodiments of the inventive concept thus prevent such damage.

In the second write operation, a verify voltage for writing data of logic "01" in state 1 is set to V1, a verify voltage for writing data of logic "00" in state 2 is set to V3, and a verify voltage for writing data of logic "10" in state 3 is set to V4. The second write time may be longer than the corresponding typical write time, while the sum of the first write time and the second write time is equal to that of the overall typical write time. In the second write operation, the logic "10" having a minimum physical voltage causing the highest reaction is allocated to state 3, and then the write operation is performed in the order of logic "00" and logic "01". This prevents errors in data or damage to the memory cells having minimum physical voltages causing lower reactions, as described above.

That is, in an embodiment, the control circuit 120 controls the program operation by setting a range of a minimum physical voltage causing a target reaction in a first write operation to be larger than a range of a minimum physical voltage causing a reaction of state 1 and state 2 in the second write operation. The control circuit 120 also controls the program operation by setting the minimum physical voltage causing the target reaction to be lower than the minimum physical voltage causing the reaction of state 2, in the second write operation for state 3, in order not to shift the minimum physical voltage causing the reaction of state 2.

In an embodiment, the control circuit 120 writes logic "11" in the write sequence memory cell array 106 if the write operation was performed from group A, and writes logic "10" in the write sequence memory cell array 106 if the write operation was performed from group B. Also, the control circuit 120 writes logic "11" in the write time memory cell array 104 when only the first data was written, and writes logic "10" or logic "00" in the write time memory cell array 104 when the second data was written.

An operation of reading multi level data is described below. For example, an operation of reading data having four levels will be described below. According to embodiments of the inventive concept, when data of the same address is stored as data having four levels, three read operations are necessary.

In the typical read method, because data of different addresses except the write unit are stored as data having four levels, the high level of an address may determine the output data by the first read operation and the low level of an address may determine the output data by the second read operation. However, according to embodiments of the inventive concept, the read time is determined by the write time, regardless of the read address. That is, the read time after the first read operation is 1 and the read time after the second read operation is 2.

Also, the read data of the two groups A and B are determined by a difference in the read group, the write sequence and the write time. The first read voltage is R1, and the output data may be determined by the first read operation with respect to the first write operation. In the case of the second write operation, when the target read group is read for the first time (e.g., the target read group is read first), the read operation is performed using the second read voltage R3 to determine the output data from the first and second data. In the case of the second write operation, when the target read group is read later (e.g., the target read group is read second), the read operation is performed using the second read voltage R2 to determine the output data from the second data. A method of determining the output data by a difference in the read group, the write sequence and the write time is illustrated in FIG. 3. In particular, as shown, FIG. 3 shows an output data determination method of a write from 'A' (first write and second write) for an 'A' read and a 'B' read, and of a write from 'B'

(first write and second write) for an 'A' read and a 'B' read. In a write from 'A'/first write/'A' read, and in a write from 'B'/first write/'B' read, a determination of data at 'R1', 11:Erase, and 10:Write are shown. In a write from 'A'/second write/'B' read, and in a write from 'B' second write/'A' read, a determination of data at 'R2', 11/01:Erase, and 00/10:Write are shown. In a write from 'A'/first write/'B' read, and in a write from 'B'/first write/'A' read, an erase data output is shown. In a write from 'A'/second write/'A' read, and in a write from 'B' second write/'B' read, a determination of data at 'R1' and 'R3' 11/10:Erase and 01/00:Write are shown.

Figure 5:
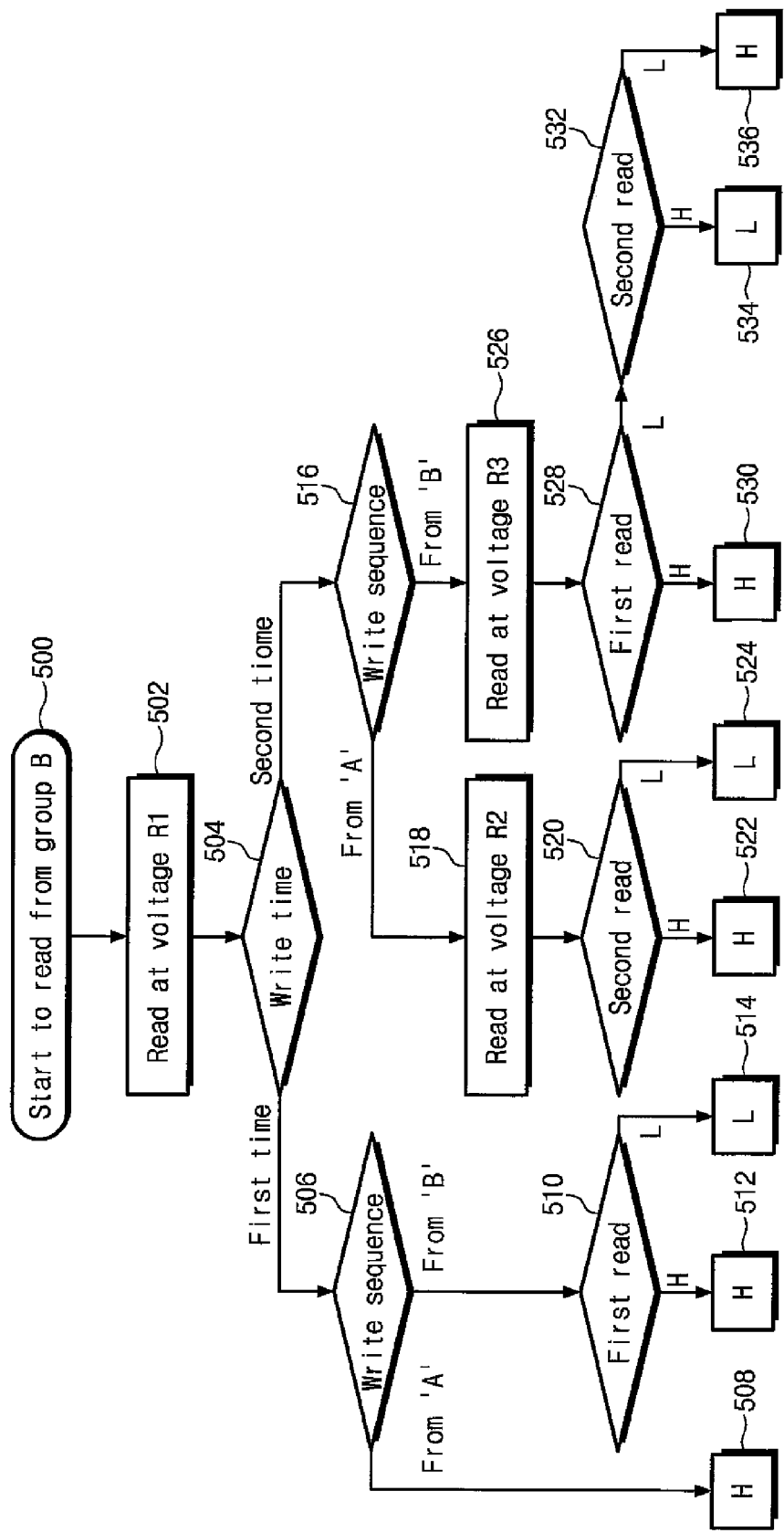
Figure 6A:
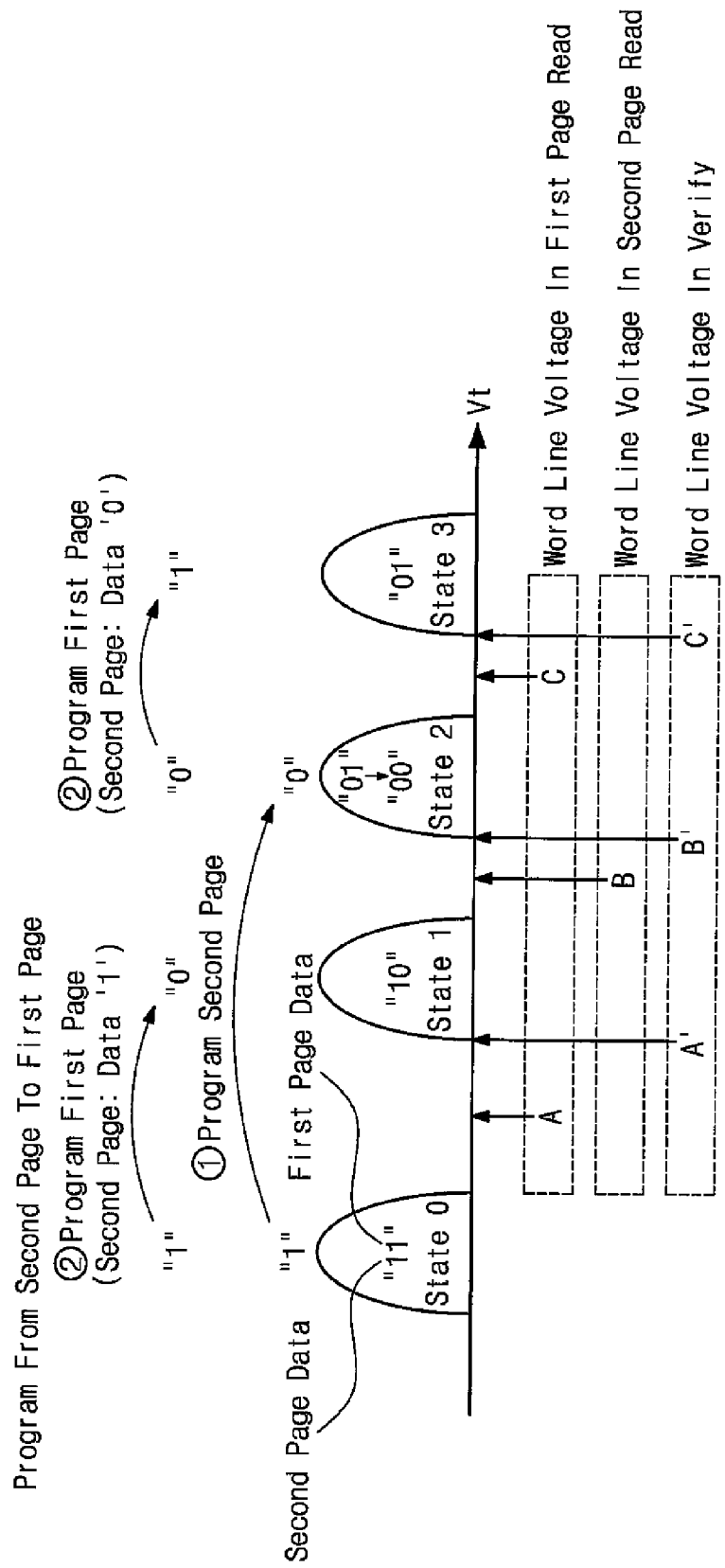
FIGS. 6A and 6B are diagrams illustrating the relationship between data of a memory cell of a conventional nonvolatile memory device and a minimum physical voltage distribution causing a reaction of the memory cell.
Figure 6B:
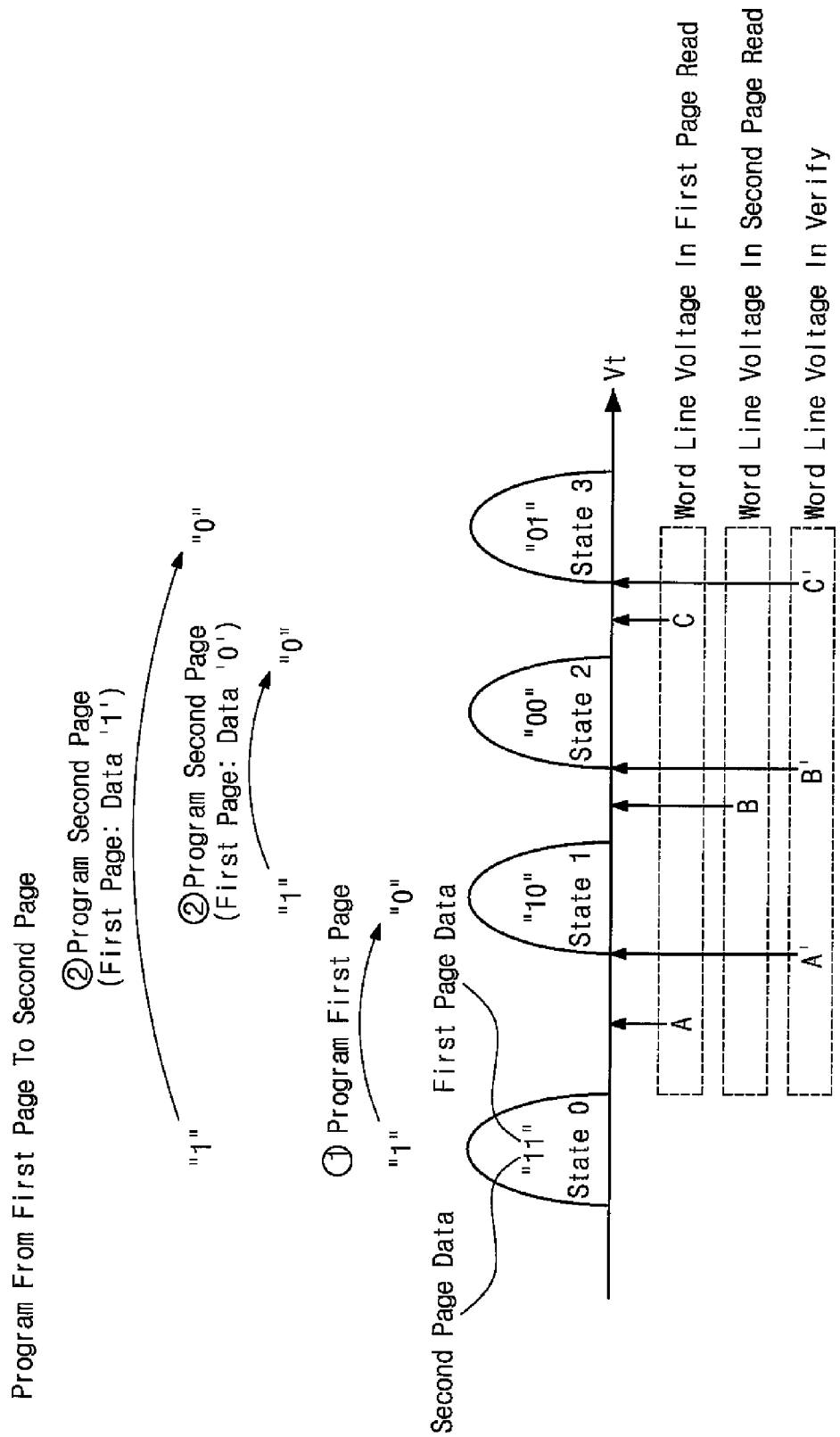

FIGS. 4 and 5 are flow charts illustrating read methods, according to various embodiments. More particularly, FIG. 4 illustrates a read flow of group A, and FIG. 5 illustrates a read flow of group B.

Referring to FIG. 4, when a read operation of group A is started (step 400), a read operation is performed using voltage R1 (step 402). Thereafter, the write time memory cell 104 is accessed to check the write time (step 404). If the write time is the first write time, the read method proceeds to step 406, and if the write time is the second write time, the read method proceeds to step 416.

If it is determined in step 404 that the write time is the first time (shown in FIG. 2), the write sequence is determined in step 406. That is, the write sequence memory cell array 106 is accessed to check which of groups A and B was written first. If group B was written first, logic 1 (H) is output (step 408). If group A was written first, it is determined in step 410 whether the logic read by the read operation (step 402) was H or L. When H was read, logic 1 (H) is output (step 412), and when L was read, logic 0 (L) is output (step 414).

If it is determined in step 404 that the write time is the second write time (shown in FIG. 2), the write sequence is determined in step 416. If group B was written first, a read operation is performed using voltage R2 in step 418. Logic 1 (H) or logic 0 (L) are output (steps 422 and 424) in response to the logic of the second read result of step 418 being H or L, respectively, as determined in step 420. If it is determined in step 416 that group A was written first, a read operation is performed using voltage R3 in step 426. If it is determined in step 428 that H was read in the read operation (step 402), logic 1 (H) is output (step 430). If it is determined in step 428 that L was read in the read operation (step 402), a second read operation is performed (step 432). If H was read in the read operation (step 426), logic 0 (L) is detected (step 434). If L was read, logic 1 (H) is detected (step 436).

Referring to FIG. 5, group B is read through steps 500 to 536 in the same manner discussed above with respect to steps 400 to 436 of FIG. 4. Thus, description of the read method will not be repeated with respect to group B for conciseness.

A method of reading logic "00" data in state 2 according to an exemplary embodiment of the inventive concept will be described with reference to FIGS. 3 to 5, as an example. The logic "00" data may be stored by allocating low logic 0 in group A and allocating low logic 0 in group B.

Referring to FIGS. 3 and 4, when group A is written first, a read operation of group A is started in step 400. In step 402, a read operation is performed using voltage R1, resulting in logic 0 (L), e.g., since state 2 is above R1. In step 404, the write time memory cell array 104 is accessed to check the write time. Because second data was written by writing logic "00" data in state 2, the write time is determined to be the second write time.

In step 416, the write sequence memory cell array 106 is accessed to check which of groups A and B was written first. Because the group A was written first in this example, the read method proceeds to step 426. In step 426, a read operation is performed using voltage R3, resulting in logic 1 (H), e.g., since state 2 is below R3. In step 428, because the first read value determined using voltage R1 in step 402 was logic 0 (L), the read method proceeds to step 432. In step 432, because the second read value determined using the voltage R3 in step 426 is logic 1 (H), the read method proceeds to step 434. In step 434, the read value of group A becomes logic 0 (L).

Referring to FIGS. 3 and 5, a read operation of group B is started in step 500. In step 502, a read operation is performed using voltage R1, resulting in logic 0 (L). In step 504, the write time memory cell array 104 is accessed to check the write time. Because the second data was written by writing logic "00" data in state 2, the write time is determined to be the second time.

In step 516, the write sequence memory cell array 106 is accessed to check which of groups A and B was written first. Because the group A was written first, the read method proceeds to step 518. In step 518, a read operation is performed using voltage R2, resulting in logic 0 (L). In step 520, because the second read value determined using voltage R2 in step 402 is logic 0 (L), the read method proceeds to step 524. In step 524, the read value of group B becomes logic 0 (L).

As described above, because group A and group B are written by allocating low logic 0, the data stored in the memory cells becomes logic "00".

Another representative read operation in the case of writing logic "00" data in state 2 from group B will be described with reference to FIGS. 3 to 5, according to an embodiment of the inventive concept.

Referring to FIGS. 3 and 4, a read operation of the group A is started in step 400. In step 402, a read operation is performed using voltage R1, resulting in logic 0 (L). In step 404, the write time memory cell array 104 is accessed to check the write time. Because the second data was written by writing logic "00" data in state 2, the write time is determined to be the second time, and the read method proceeds to step 416.

In step 416, the write sequence memory cell array 106 is accessed to check which of the groups A and B was written first. Because group B was written first in this example, the read method proceeds to step 418. In step 418, a read operation is performed using voltage R2, resulting in logic 0 (L). In step 420, because the second read value determined using voltage R2 in step 418 is logic 0 (L), the read method proceeds to step 424. In step 424, the read value of group A becomes logic 0 (L).

Referring to FIGS. 3 and 5, a read operation of group B is started in step 500. In step 502, a read operation is performed using voltage R1, resulting in logic 0 (L). In step 504, the write time memory cell array 104 is accessed to check the write time. Because the second data was written by writing logic "00" data in state 2, the write time is determined to be the second time, and the read method proceeds to step 516.

In step 516, the write sequence memory cell array 106 is accessed to check which of the groups A and B was written first. Because the group B was written first, the read method proceeds to step 526. In step 526, a read operation is performed using voltage R3, resulting in logic 1 (H). In step 528, because the first read value determined using voltage R1 in step 502 is logic 0 (L), the read method proceeds to step 532. In step 532, because the second read value determined using the voltage R3 in step 526 is logic 1 (H), the read method proceeds to step 534. In step 534, the read value of group B becomes logic 0 (L).

As described above, because group A and group B are written by each allocating low logic 0, the data stored in the memory cells becomes logic "00".

As described above, various embodiments of the inventive concept set two groups of a unit capable of simultaneously allocating the high level and the low level of multi level data, and provide the write sequence memory cell array and the write time memory cell array, making it possible to increase the write speed regardless of the write sequence. Also, various embodiments of the inventive concept reduce the minimum physical voltage causing a reaction of the first read operation, thereby making it possible to increase the first write speed. Also, various embodiments of the inventive concept prevent damage or errors to data due to the second write, thus making it possible to increase the reliability of the memory cells. Also, various embodiments of the inventive concept can determine the output data through the first or second read by providing the write sequence memory cell array and the write time memory cell array.

As described above, the exemplary embodiments of the inventive concept increase the data write/read operation speeds and minimize the influence on the minimum physical voltage causing the preset low reaction in the second maximum voltage write operation.

While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A nonvolatile memory device, comprising:
    a data memory cell array including multi level memory cells divided into two groups to store multi level data respectively in the multi level memory cells of each group;
    a write sequence memory cell array configured to store a write sequence indicating in which of the two groups the respective multi level data was written first;
    a write time memory cell array configured to store a number of write operations performed on the multi level memory cells; and
    a control circuit configured to control a program operation comprising writing data in the data memory cell array and a read operation comprising reading data from the data memory cell array,
    wherein the control circuit controls the program operation by determining allocation of data corresponding to a minimum physical voltage distribution causing a reaction of the multi level memory cells, such that a shift of a first minimum physical voltage causing the reaction due to the first write operation and a shift of a second minimum physical voltage causing the reaction due to the second write operation are equal regardless of the write sequence.

2. The nonvolatile memory device of claim 1, wherein each group is set to store data that is more than a maximum number of words that are writable at a time.

3. A nonvolatile memory device comprising:
    a data memory cell array including multi level memory cells divided into two groups to store multi level data, respectively, in the corresponding multi level memory cells of each group, wherein minimum physical voltages causing reactions of state 0, state 1, state 2 and state 3, set to sequentially increase minimum physical voltages causing the reactions, are different from each other;
    a write sequence memory cell array configured to store a write sequence indicating in which of the two groups the respective multi level data was first written;
    a write time memory cell array configured to store a number of write operations on the multi level memory cells; and
    a control circuit configured to control a program operation of writing data in the data memory cell array and a read operation of reading data from the data memory cell array,
    wherein the control circuit controls the program operation by setting a target range of a target minimum physical voltage causing a target reaction in a first write operation to be larger than a range of the minimum physical voltage causing the reaction of state 1 and state 2 in a second write operation, and setting the target minimum physical voltage causing the target reaction to be lower than the minimum physical voltage causing the reaction of state 2, in the second write operation for state 3, in order not to shift the minimum physical voltage causing the reaction of state 2.

4. The nonvolatile memory device of claim 3, wherein the second write operation is performed in an order of the state 3, state 2 and state 1.

5. The nonvolatile memory device of claim 3, wherein the write data is configured to allocate logic "11", logic "01", logic "00" and logic "10" to state 0, state 1, state 2 and the state 3, respectively.

* * * * *